United States Patent
Meng et al.

(10) Patent No.: US 10,224,497 B2
(45) Date of Patent: Mar. 5, 2019

(54) FLEXIBLE SUBSTRATE AND FLEXIBLE DISPLAY

(71) Applicant: Wuhan China Star Optoelectronics Technology Co., Ltd., Wuhan, Hubei (CN)

(72) Inventors: Lin Meng, Guangdong (CN); Caiqin Chen, Guangdong (CN); Tao Sun, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 60 days.

(21) Appl. No.: 15/544,019

(22) PCT Filed: Apr. 26, 2017

(86) PCT No.: PCT/CN2017/082047
§ 371 (c)(1),
(2) Date: Jul. 16, 2017

(87) PCT Pub. No.: WO2018/170999
PCT Pub. Date: Sep. 27, 2018

(65) Prior Publication Data
US 2018/0337366 A1    Nov. 22, 2018

(51) Int. Cl.
| | |
|---|---|
| *H01L 29/08* | (2006.01) |
| *H01L 51/40* | (2006.01) |
| *H01L 51/00* | (2006.01) |
| *H01L 51/52* | (2006.01) |
| *H01L 51/56* | (2006.01) |
| *H01L 23/532* | (2006.01) |

(52) U.S. Cl.
CPC .... *H01L 51/0097* (2013.01); *H01L 23/53295* (2013.01); *H01L 51/0035* (2013.01); *H01L 51/5256* (2013.01); *H01L 51/56* (2013.01); *H01L 2251/5338* (2013.01)

(58) Field of Classification Search
CPC ............. H01L 51/5256; H01L 51/0035; H01L 51/0097; H01L 51/56; H01L 23/53295
See application file for complete search history.

(56) References Cited

U.S. PATENT DOCUMENTS

| | | | | |
|---|---|---|---|---|
| 2014/0217383 | A1* | 8/2014 | Park ..................... | H01L 51/56 257/40 |
| 2015/0340653 | A1* | 11/2015 | Yang ................... | H01L 51/5256 257/40 |
| 2016/0141528 | A1* | 5/2016 | Masuyama .......... | G02B 5/1814 257/40 |

* cited by examiner

*Primary Examiner* — Alonzo Chambliss
(74) *Attorney, Agent, or Firm* — Andrew C. Cheng

(57) ABSTRACT

Disclosed is a flexible substrate, comprising a first organic layer, a first inorganic layer, a second organic layer and a second inorganic layer. The first inorganic layer is located on the first organic layer. The first inorganic layer comprises first strips which are spaced. The first strip comprises a first middle part and two first side parts. The second organic layer covers the first inorganic layer. The second inorganic layer is located on one side of the second organic layer remote from the first organic layer. The second inorganic layer comprises second strips which are spaced. The second strip comprises a second middle part and two second side parts. An extension direction of the second strips is the same as an extension direction of the first strips, the second organic layer is partially interposed between two first strips and between two second strips which are adjacent.

20 Claims, 8 Drawing Sheets

FLEXIBLE SUBSTRATE AND FLEXIBLE DISPLAY

CROSS REFERENCE

This application claims the priority of Chinese Patent Application No. 201710179544.2, entitled "Flexible substrate and flexible display", filed on Mar. 23, 2017, the disclosure of which is incorporated herein by reference in its entirety.

FIELD OF THE INVENTION

The present invention relates to a display device technology field, and more particularly to a flexible substrate and a flexible display utilizing the flexible substrate.

BACKGROUND OF THE INVENTION

The flexible display with flexible, wearable, light, thin, low power consumption, low radiation properties and is considered to be the next generation of display. Now the flexible display has been widely used in a variety of high-end display terminal products.

In the flexible displays, thin film transistors (TFTs) or other functional devices are formed on a flexible substrate typically to achieve the display result. The flexible substrate generally requires better water vapor, oxygen insulation to ensure the stability of functional devices.

A plurality of organic layers and a plurality of inorganic layers are alternately arranged in general in the conventional flexible substrate. Both the organic layers and the inorganic layers are continuous whole layer structures. The function of preventing water vapor and oxygen from penetrating into the functional devices on the substrate is achieved with the inorganic layers. With the proposed concept of foldable, wearable terminals, the flexibility of flexible substrates has been increasingly concerned for the modern flexible displays. In the conventional flexible substrate, since the stresses of the plurality of inorganic layers are worse. For instance, the inorganic layers made of silicon oxide (SiO2) material are used. When the bending range is large, the inorganic layers tend to crush each other and cause cracking. The spikes generated by the cracking of the inorganic layers will damage the organic layers. Accordingly, the water vapor and oxygen penetrate into the devices and result in the abnormal display of the flexible display.

SUMMARY OF THE INVENTION

An objective of the present invention is to provide a flexible substrate having good bending performance.

Besides, the present invention further provides a flexible utilizing the flexible substrate.

For realizing the aforesaid objective, the technical solution utilized by the embodiments of the present invention is:

providing a flexible substrate, comprising:

a first organic layer;

a first inorganic layer, patterned and provided on the first organic layer, wherein the first inorganic layer comprises a plurality of first strips which are spaced and the first strip comprises a first middle part and first side parts at two sides of the first middle part;

a second organic layer, covering the first inorganic layer; and a second inorganic layer, patterned and located on one side of the second organic layer remote from the first organic layer, wherein the second inorganic layer comprises a plurality of second strips which are spaced and the second strip comprises a second middle part and second side parts at two sides of the second middle part;

wherein an extension direction of the second strips is the same as an extension direction of the first strips, the second organic layer is partially interposed between two first strips which are adjacent and partially interposed between two second strips which are adjacent, the first middle parts and the second middle parts are staggered and the first side parts and the second side parts are overlapped.

Widths of the first side parts at the two sides of the first middle part are equal.

A ratio of a width of the first middle part to the width of the first side part is a first value and the first value is equal to or larger than 2 and less than or equal to 3.

A ratio of a width of the second middle part to the width of the second side part is a second value and the second value is equal to the first value.

A thickness of the first inorganic layer is equal to a thickness of the second inorganic layer.

A thickness of the first inorganic layer is less than a thickness of the second organic layer.

The first strip comprises a first top surface and a first bottom surface which are oppositely arranged and first side surfaces connected between the first top surface and the first bottom surface, the first bottom surface is attached on the first organic layer, a first included angle is formed between the first side surface and the first bottom surface, the first included angle is equal to or larger than 30 degrees and equal to or less than 60 degrees.

The first organic layer and the second organic layer are made of a polyimide material.

The flexible substrate further comprises a protective layer. The protective layer is located on one side of the second organic layer remote from the first organic layer and covers the second organic layer.

On the other hand, the present invention further provides a flexible display including the aforesaid flexible substrate.

Compared with prior art, the present invention possesses benefits below:

Since both the first strips and the second strips are extended along the same direction (defined as a first direction), the first strips are spaced, the second strips are spaced and the second organic layer is partially interposed between two first strips which are adjacent and partially interposed between two second strips which are adjacent. As the flexible substrate is bent in a vertical plane of the first direction, the second organic layer can effectively buffer and balance stresses on the plurality of the first strips and the plurality of the second strips so that the plurality of the first strips and the plurality of the second strips are uniformly stressed. Thus, the stress issue of the first inorganic layer and the second inorganic layer can be improved to reduce the risk that the first inorganic layer and the second inorganic layer crack for improving the bending performance of the flexible substrate. Since the first middle parts and the second middle parts are staggered and the first side parts and the second side parts are overlapped, the first inorganic layer and the second inorganic layer collectively form a protection for the entire surface of the flexible substrate so as to prevent water vapor and oxygen from penetrating the flexible substrate. In short, the flexible substrate does not only possess the ability to insulate water vapor and oxygen but also good bending performance. Thus, the flexible display utilizing the flexible substrate can have longer lifetime and obtain the better bending performance.

BRIEF DESCRIPTION OF THE DRAWINGS

In order to more clearly illustrate the embodiments of the present invention, the following figures will be described in the embodiments are briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are merely part of embodiments of the present invention, but not all embodiments. Based on the embodiments of the present invention, all other embodiments to those of ordinary skill in the premise of no creative efforts obtained, should be considered within the scope of protection of the present invention.

Besides, the following descriptions for the respective embodiments are specific embodiments capable of being implemented for illustrations of the present invention with referring to appended figures. For example, the terms of up, down, front, rear, left, right, interior, exterior, side, etcetera are merely directions of referring to appended figures. Therefore, the wordings of directions are employed for explaining and understanding the present invention but not limitations thereto.

In the description of the application, which needs explanation is that the term "installation", "connected", "connection", "located on . . . " should be broadly understood unless those are clearly defined and limited, otherwise, For example, those can be a fixed connection, a detachable connection, or an integral connection; those can be a mechanical connection, or an electrical connection; those can be a direct connection, or an indirect connection with an intermediary, which may be an internal connection of two elements. To those of ordinary skill in the art, the specific meaning of the above terminology in the present invention can be understood in the specific circumstances.

Besides, in the description of the present invention, unless with being indicated otherwise, "plurality" means two or more. In the present specification, the term "process" encompasses an independent process, as well as a process that cannot be clearly distinguished from another process but yet achieves the expected effect of the process of interest. Moreover, in the present specification, any numerical range expressed herein using "to" refers to a range including the numerical values before and after "to" as the minimum and maximum values, respectively. In figures, the same reference numbers will be used to refer to the same or like parts.

Figure 1:
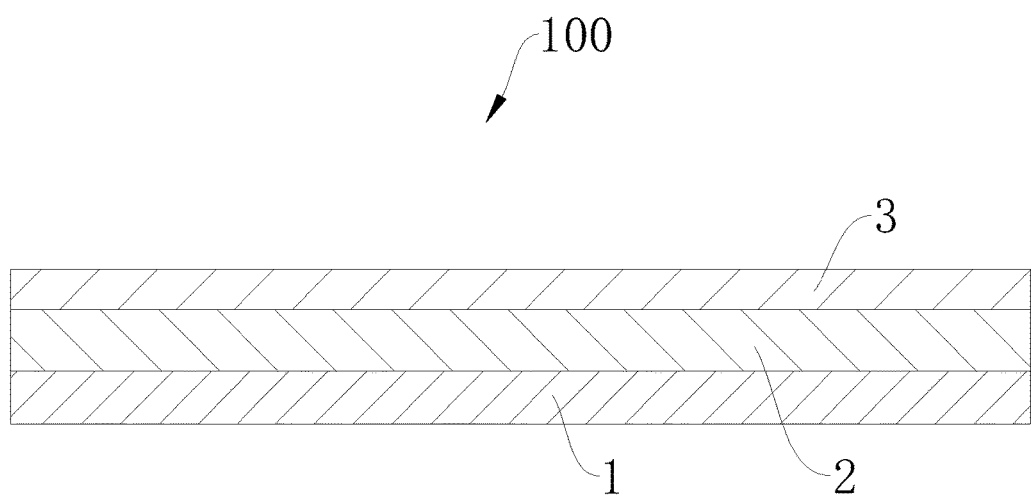
FIG. 1 is a structure diagram of a flexible display provided by the embodiment of the present invention.

Please refer to FIG. 1. The embodiment of the present invention provides a flexible display 100. The flexible display 100 comprises a flexible substrate 1, a component layer 2 formed on the flexible substrate 1 and a package layer 3 formed on one side of the component layer 2 remote from the flexible substrate 1. The flexible substrate 1 carries the component layer 2. The component layer 2 is used for display and can utilize the Organic Light-Emitting Diode (OLED) component layer. The package layer 3 is used to package and protect the component layer 2.

Figure 7:
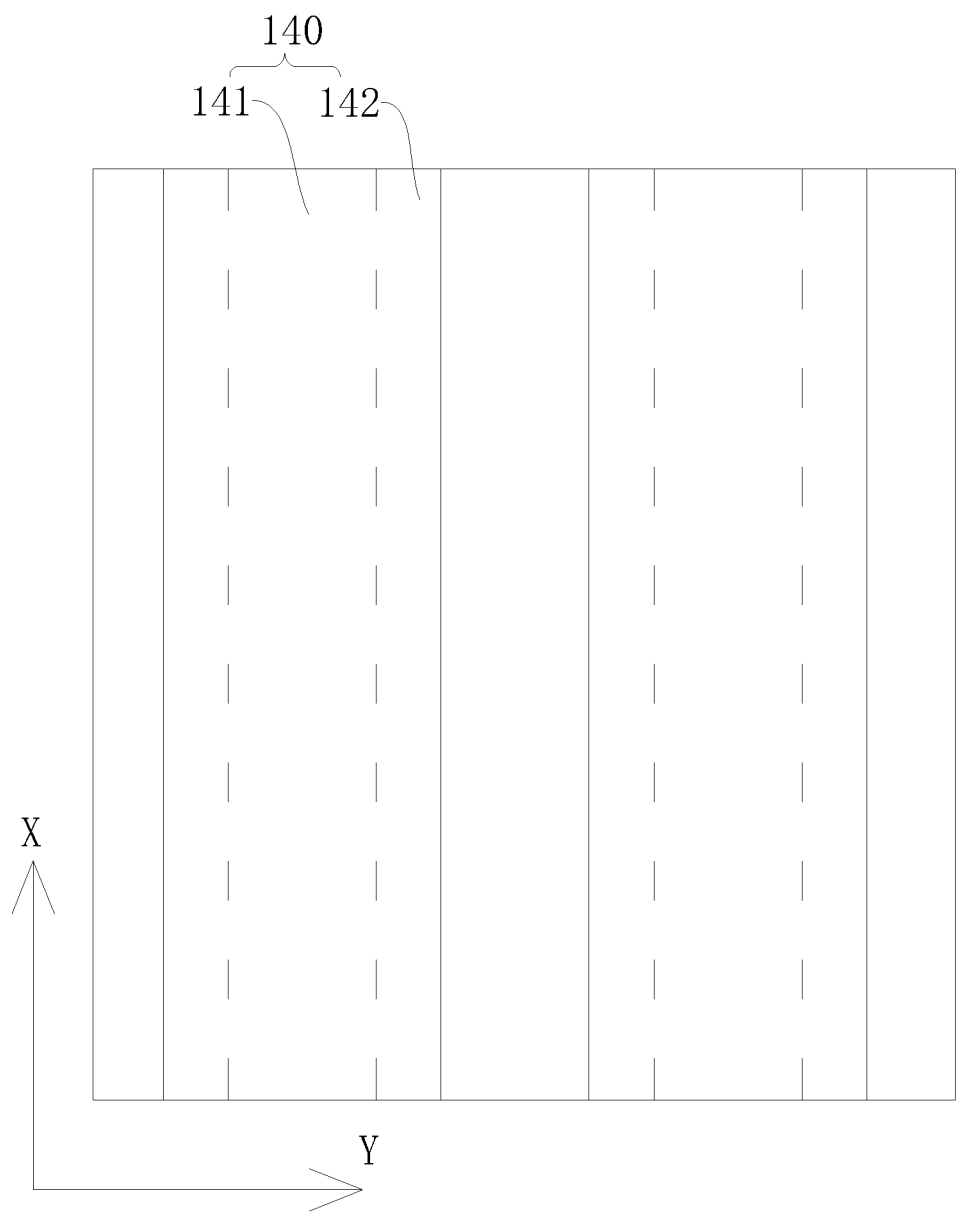
FIG. 7 is a top view diagram of the structure shown in FIG. 6.
Figure 8:
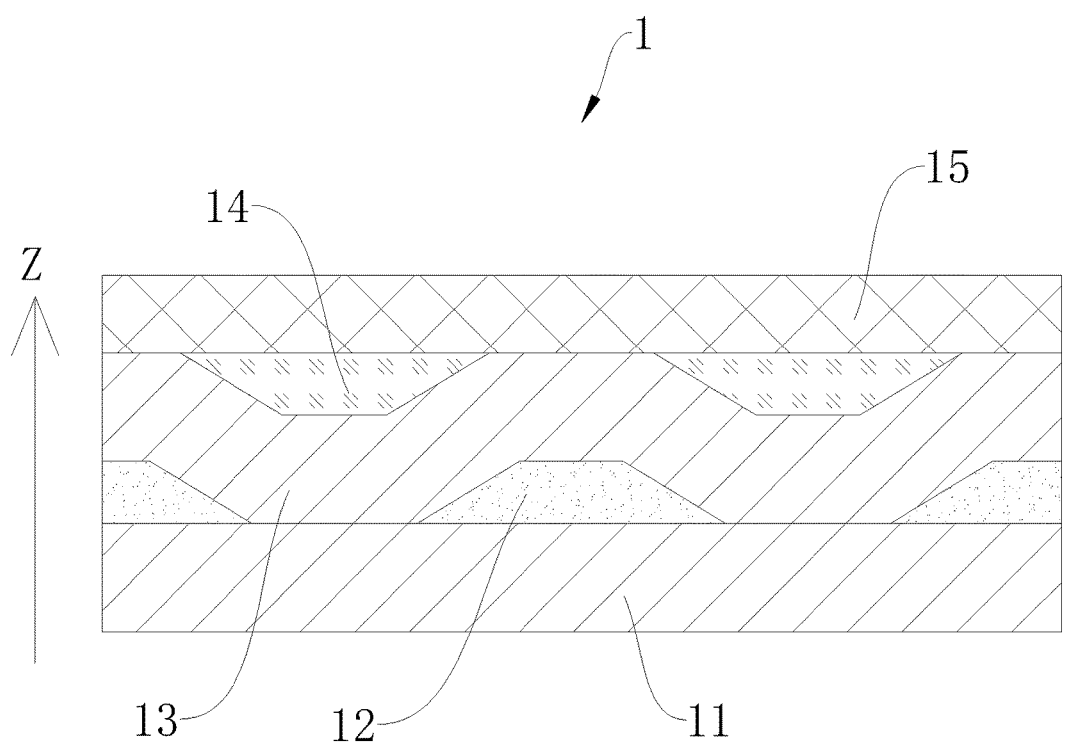
FIG. 8 is a structure diagram corresponding to Step S05 in a manufacturing method of a flexible substrate provided by the embodiment of the present invention.
Figure 9:
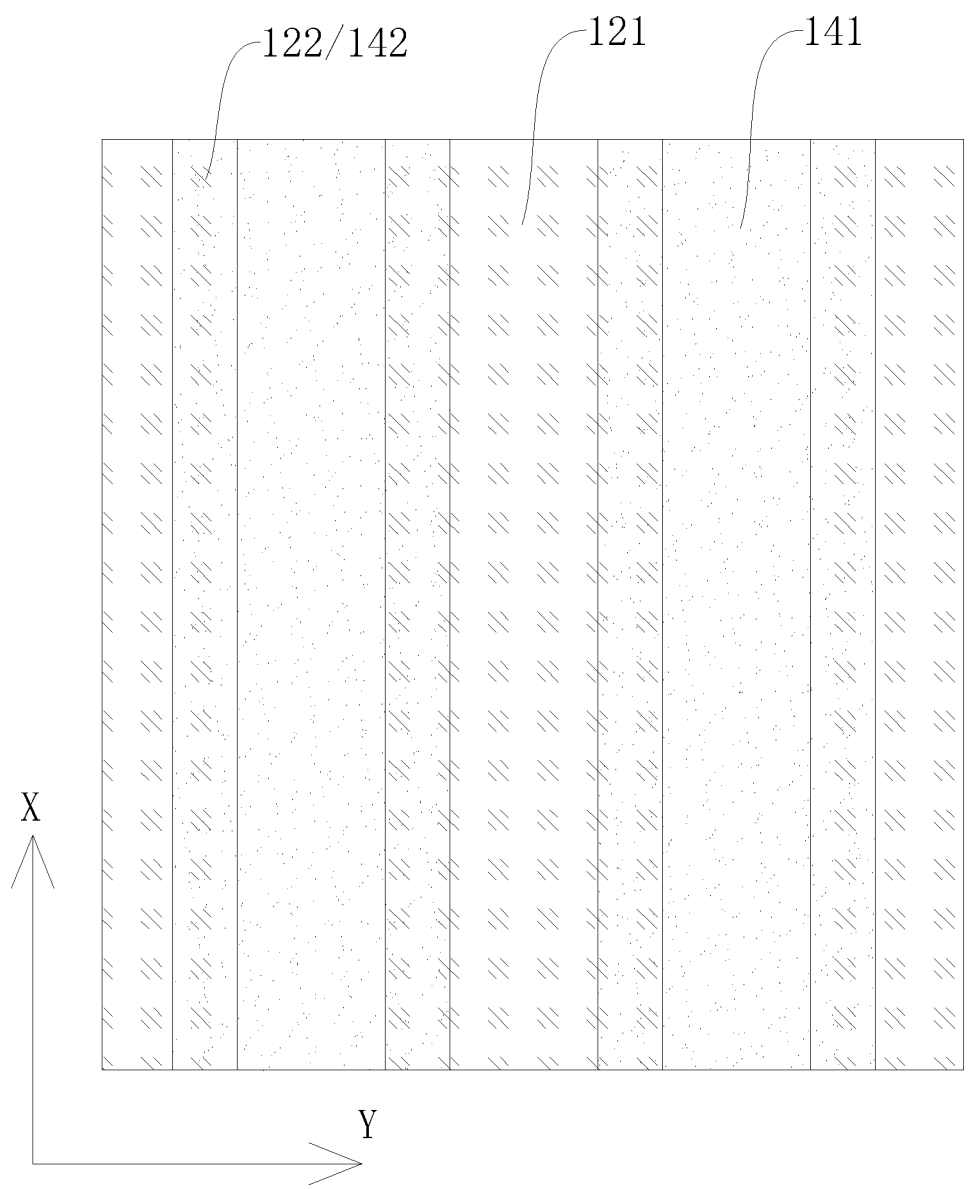
FIG. 9 is an orthographic projection diagram of a first inorganic layer and a second inorganic layer of the flexible substrate shown in FIG. 8 on a first organic layer.

Please refer to FIG. 1 to FIG. 9. The flexible substrate 1 comprises a first organic layer 11, a first inorganic layer 12, a second organic layer 13 and a second inorganic layer 14. The first inorganic layer 12 is provided on the first organic layer 11. The first inorganic layer 12 is patterned and provided. The first inorganic layer 12 comprises a plurality of first strips 120 which are spaced and the first strip 120 comprises a first middle part 121 and first side parts 122 at two sides of the first middle part 121. The second organic layer 13 is formed on the first organic layer 11 and covers the first inorganic layer 12. The second inorganic layer 14 is located on one side of the second organic layer 13 remote from the first organic layer 11. The second inorganic layer 14 is patterned and provided. The second inorganic layer 14 comprises a plurality of second strips 140 which are spaced and the second strip 140 comprises a second middle part 141 and second side parts 142 at two sides of the second middle part 141. An extension direction of the second strips 140 is the same as an extension direction of the first strips 120. The second organic layer 13 is partially interposed between two first strips 120 which are adjacent and partially interposed between two second strips 140 which are adjacent. Specifically, both the first strips 120 and the second strips 140 are extended along a first direction X. A first gap exists between the two first strips 120 which are adjacent. The second organic layer 13 is partially interposed in the first gap. A second gap exists between the two second strips 140 which are adjacent. The second organic layer 13 is partially interposed in the second gap. In the vertical direction Z of the first organic layer 11, the first middle parts 121 and the second middle parts 141 are staggered and the first side parts 122 and the second side parts 142 are overlapped. Orthographic projections of the first middle parts 121 on the first organic layer 11 and orthographic projections of the second middle parts 141 on the first organic layer 11 are staggered and not overlapped with each other. Orthographic projections of the first side parts 122 on the first organic layer 11 and orthographic projections of the second side parts 142 on the first organic layer 11 are overlapped with each other. As shown in FIG. 9, the areas only filled with oblique short lines represent the orthographic projections of the first middle parts 121 on the first organic layer 11. The areas only filled with dots represent the orthographic projections of the second middle parts 141 on the first organic layer 11. The area filled with oblique short lines and dots represent overlapped orthographic projections of the first side parts 122 and the second side parts 142 on the first organic layer 11.

In this embodiment, since both the first strips 120 and the second strips 140 are extended along a first direction X, the first strips 120 are spaced, the second strips 140 are spaced and the second organic layer 13 is partially interposed between two first strips 120 which are adjacent and partially interposed between two second strips 140 which are adjacent, as the flexible substrate 1 is bent in a vertical plane of the first direction X, the second organic layer 13 can effectively buffer and balance stresses on the plurality of the first strips 120 and the plurality of the second strips 140 so that the plurality of the first strips 120 and the plurality of the second strips 140 are uniformly stressed. Thus, the stress issue of the first inorganic layer 12 and the second inorganic layer 14 can be improved to reduce the risk that the first inorganic layer 12 and the second inorganic layer 14 crack for improving the bending performance of the flexible substrate 1. Since the first middle parts 121 and the second middle parts 141 are staggered and the first side parts 122 and the second side parts 142 are overlapped, the first inorganic layer 12 and the second inorganic layer 14 collectively form a protection for the entire surface of the flexible substrate 1 so as to prevent water vapor and oxygen from penetrating the flexible substrate 1 and penetrating into the device layer 2. In short, the flexible substrate 1 does not only possess the ability to insulate water vapor and oxygen but also good bending performance. Thus, the flexible display 100 utilizing the flexible substrate 1 can have longer lifetime and obtain the better bending performance.

It can be understood that the flexible substrate 1 is bent in a vertical plane of the first direction X means that the bending direction and the bending trajectory of the flexible substrate 1 are in the vertical plane of the first direction X. The first direction X of the flexible substrate 1 according to the present invention can be set in accordance with the bending operation of the flexible display 100. The first direction X is perpendicular with the plane where the bending operation of the flexible display 100 is so that the flexible display 100 can have the good bending performance.

Since the second organic layer 13 covers on the plurality of the first strips 120 and the first organic layer 11, the second organic layer 13 has a concave portion and a convex portion (similar as waves) which are sequentially connected and the second organic layer 13 has a convex concave appearance. Compared to the planar form of prior art, the appearance of the second organic layer 13 can better withstand and accommodate the frequent bending and flattening operations. The second organic layer 13 can have better bending performance. Similarly, the second organic layer 13 can better buffer the stresses between the plurality of the first strips 120 and the plurality of the second strips 140.

Figure 3:
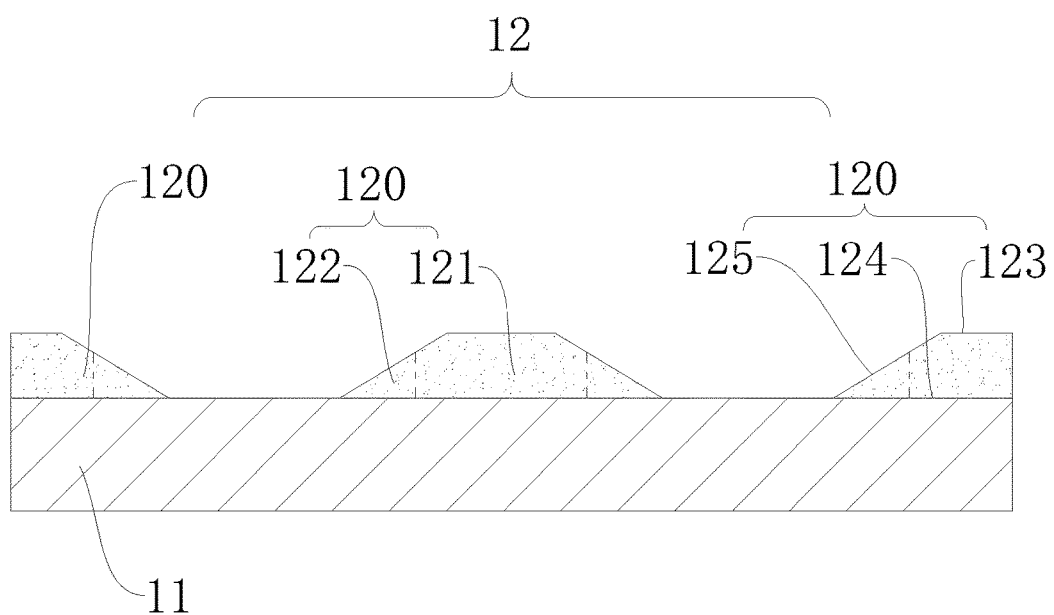
FIG. 3 is a structure diagram corresponding to Step S02 in a manufacturing method of a flexible substrate provided by the embodiment of the present invention.
Figure 4:
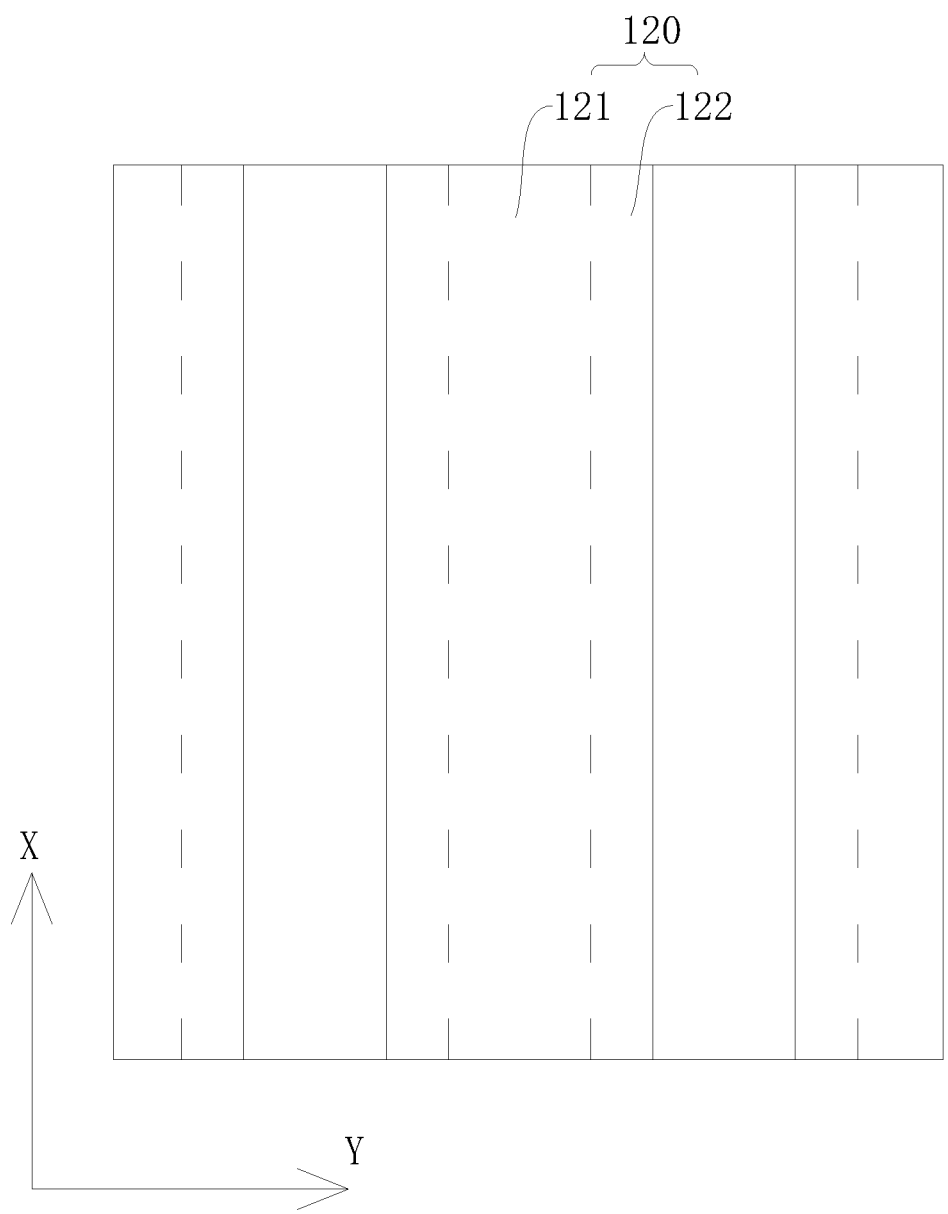
FIG. 4 is a top view diagram of the structure shown in FIG. 3.

As being a possible embodiment as shown in FIG. 3 and FIG. 4, in the second direction Y which is perpendicular with the first direction X (both the first direction X and the second direction Y are in the plane direction of the first organic layer 11), the widths of the first side part 122 at the two sides of the first middle part 121 are equal. Then, the first side parts 122 at the two sides can be disposed symmetrically with respect to the first middle portion 121.

Figure 6:
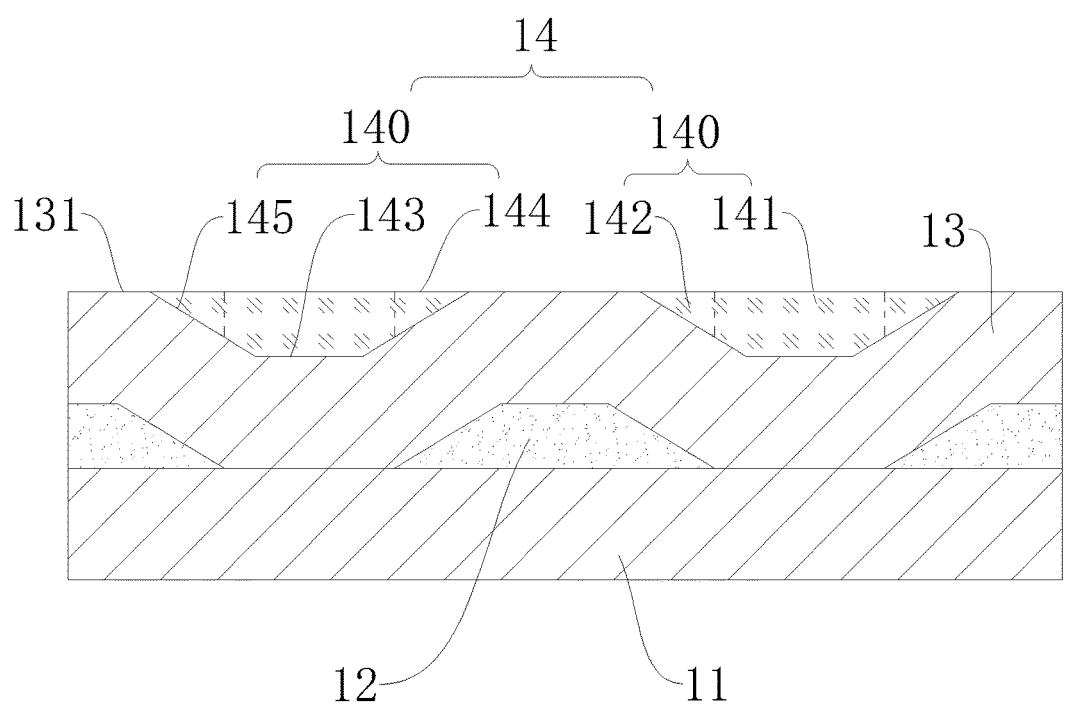
FIG. 6 is a structure diagram corresponding to Step S04 in a manufacturing method of a flexible substrate provided by the embodiment of the present invention.

As shown in FIG. 6 and FIG. 7, in the second direction Y which is perpendicular with the first direction X, the widths of the second side parts 142 at the two sides of the second middle part 141 are equal. Then, the second side parts 142 at the two sides can be disposed symmetrically with respect to the second middle portion 141.

Selectably, in the second direction Y, a ratio of a width of the first middle part 121 to the width of the first side part 122 is a first value and the first value is equal to or larger than 2 and less than or equal to 3.

In this embodiment, the first value is equal to or larger than 2 and less than or equal to 3 and the overlapping area and the non-overlapping area of the first strips 120 with the second strips 140 are reasonably arranged. Thus, in the condition that the flexible substrate 1 is either flattened or bent, the first inorganic layer 12 and the second inorganic layer 14 still have portions overlapped with each other and portions staggered with each other. Accordingly, the flexible substrate 1 can be ensured to have the ability of insulating water vapor and oxygen and the good bending performance.

It can be understood that in the condition that the flexible substrate 1 is either flattened or bent, the first middle parts 121 and the second middle parts 141 are always staggered with each other in the vertical direction Z of the first organic layer 11 and the first side parts 122 and the second side parts 142 are always overlapped with each other. The overlapping areas of the first side parts 122 and the second side parts 142 change correspondingly to the bent shape of the flexible substrate 1.

Selectably, in the second direction Y, a ratio of a width of the second middle part 141 to the width of the first side part 142 is a second value and the second value is equal to the first value. Then, in the plane direction of the first organic layer 11, the second middle part 141 has the same shape and size as the first middle part 121 and the second side part 142 has the same shape and size as the first side part 122. Thus, the manufacturing process of the flexible substrate 1 can be simplified to reduce the production cost of the flexible substrate 1.

Figure 5:
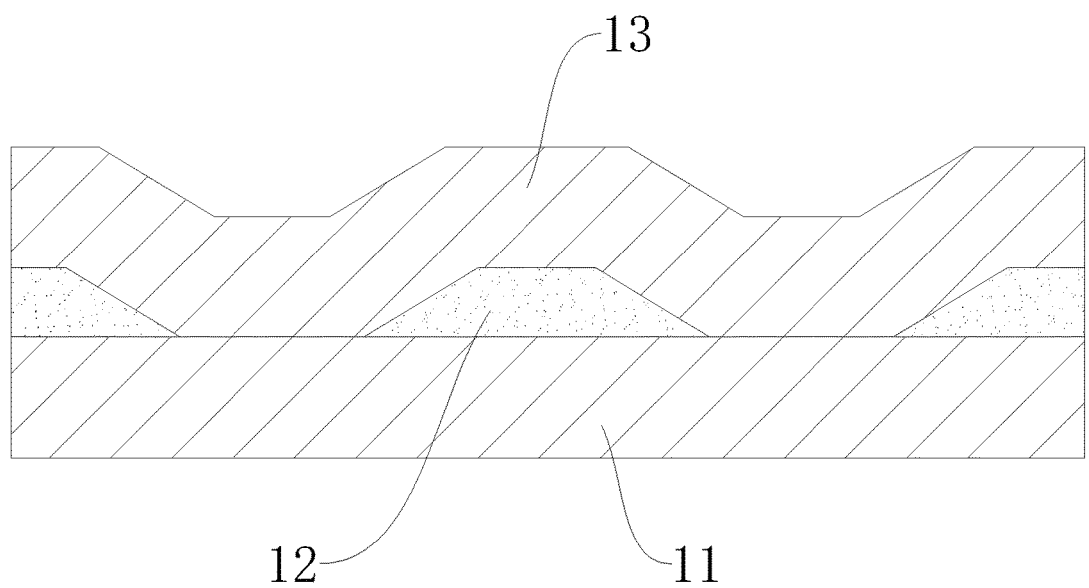
FIG. 5 is a structure diagram corresponding to Step S03 in a manufacturing method of a flexible substrate provided by the embodiment of the present invention.

Selectably, as shown in FIG. 3, FIG. 5 and FIG. 6, a thickness of the first inorganic layer 12 is equal to a thickness of the second inorganic layer 14. Then, a thickness of the first strips 120 is equal to a thickness of the second strips 140. Since the thicknesses of all areas of the second organic layer 13 are kept uniform. The second organic layer 13 is partially interposed in an area between the adjacent first strips 120 to form a groove. The thickness of the first strips 120 is equal to the thickness of the second strips 140. Thus, the second strips 140 are just interposed into the groove and a surface of the second strip 140 remote from the first organic layer 11 and an area 131 of the second organic layer 13 which is remote from the surface of the first organic layer 11 and not connected with the second strip 140 are flat or roughly flat. It is beneficial for reducing the difficulty of the following manufacturing process and meanwhile reducing the thickness of the flexible substrate 1. The second organic layer 13 simultaneously isolates the plurality of first strips 120 and the plurality of the second strips 140 well so that the bending performance of the flexible substrate 1 can be better.

Selectably, both the thickness of the first strips 120 and the thickness of the second strips 140 is less than the thickness of the second organic layer 13 so that the second organic layer 13 can sufficiently achieve the stress buffer for the plurality of the first strips 120 and the plurality of the second strips 140.

As being a possible embodiment as shown in FIG. 3, the first strip 120 comprises a first top surface 123 and a first bottom surface 124 which are oppositely arranged and first side surfaces 125 connected between the first top surface 123 and the first bottom surface 124. The first bottom surface 124 is attached on the first organic layer 11. The first top surface 123 and the first side surfaces 125 are connected with the second organic layer 13. A first included angle is formed between the first side surface 125 and the first bottom surface 124. The first included angle is equal to or larger than 30 degrees and equal to or less than 60 degrees. The first included angle can be 30 degrees, 45 degrees or 60 degrees.

As shown in FIG. 6, the second strip 140 comprises a second top surface 143 and a second bottom surface 144 which are oppositely arranged and second side surfaces 145 connected between the second top surface 143 and the second bottom surface 144. The second top surface 143 and the second side surfaces 145 are connected with the second organic layer 13. The second bottom surface 144 is arranged to be remote from the first organic layer 11. The second bottom surface 144 and an area 131 of the second organic layer 13 which is remote from the surface of the first organic layer 11 and not connected with the second strip 140 are flat or roughly flat. A second included angle is formed between the second side surface 145 and the second bottom surface 144. The second included angle is equal to or larger than 30 degrees and equal to or less than 60 degrees. The second included angle can be 30 degrees, 45 degrees or 60 degrees.

Please refer from FIG. 3 to FIG. 9. In one embodiment, the first top surface 123 is at the first middle part 121. A part of the first side surface 125 connected to the first top surface 123 is at the first middle part 121. A part of the first side surface 125 connected to the first bottom surface 124 is at the first side part 122. The second top surface 143 is at the second middle part 141. A part of the second side surface 145 connected to the second top surface 143 is at the second middle part 141. A part of the second side surface 145 connected to the second bottom surface 144 is at the second side part 142.

As being a possible embodiment, both the first organic layer 11 and the second organic layer 13 are made of a polyimide (PI) material. Both the first inorganic layer 12 and the second inorganic layer 14 are made of silicon oxide (SiO2) material.

As being a possible embodiment as shown in FIG. 6 and FIG. 8, the flexible substrate 1 further comprises a protective layer 15. The protective layer 15 is formed on one side of the second organic layer 13 remote from the first organic layer 11 and covers the second organic layer 14. The protective layer 15 can protect the second organic layer 13 and the second organic layer 14. Then, the surface of the second strip 140 remote from the first organic layer 11 (i.e. the second bottom surface 144) contacts with and is connected with the protective layer 15. The area 131 of the second organic layer 13 which is remote from the surface of the first organic layer 11 and not connected with the second strip 140 also contacts with and is connected with the protective layer 15. Since the surface of the second strip 140 remote from the first organic layer 11 (i.e. the second bottom surface 144) and the area 131 of the second organic layer 13 which is remote from the surface of the first organic layer 11 and not connected with the second strip 140 are flat or roughly flat. Therefore, the protective layer 15 is flat, the process difficulty is decreased and thereby the cost of the flexible substrate 1 is reduced. Meanwhile, the plurality of second strips 140 are sandwiched between the second organic layer 13 of the entire surface and the protective layer 15 of the entire surface. Thus, the second organic layer 13 has better bending performance.

Selectably, the protective layer 15 is made of silicon nitride (SiNx) material, thus can isolate water vapor and oxygen in advance for promoting the ability of the flexible substrate 1 of insulating water vapor and oxygen.

Figure 2:
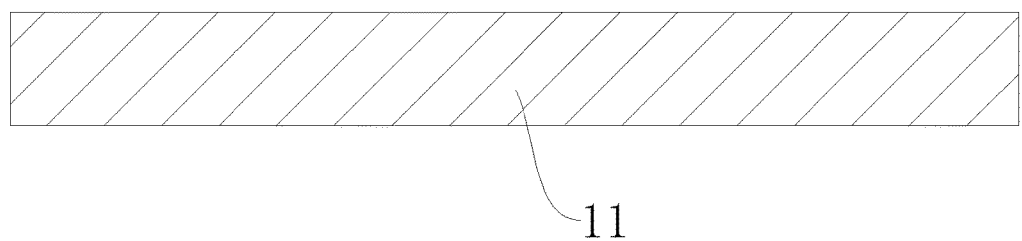
FIG. 2 is a structure diagram corresponding to Step S01 in a manufacturing method of a flexible substrate provided by the embodiment of the present invention.

Please refer from FIG. 2 to FIG. 9. The present invention further provides a manufacturing method of a flexible substrate for manufacturing the aforesaid flexible substrate 1. The manufacturing method of the flexible substrate comprises:

Step S01, as shown in FIG. 2, forming a first organic layer 11 by a coating process and a curing process.

Step S02, as shown in FIG. 3 and FIG. 4, a first inorganic coating layer is formed on the first organic layer 11 for an entire surface by a chemical vapor deposition process. The first inorganic coating layer is patterned by exposure process, etching process and development process to form a first inorganic layer 12 so that the first inorganic layer 12 comprises a plurality of first strips 120 which are spaced and the first strip 120 comprises a first middle part 121 and first side parts 122 at two sides of the first middle part 121.

Step S03, as shown in FIG. 5, forming a second organic layer 13 covering the first inorganic layer 12 on the first organic layer by a coating process and a curing process. Then, the second organic layer 13 is partially interposed between two first strips 120 which are adjacent. The first strips 120 which are adjacent are isolated by the second organic layer 13.

Step S04, as shown in FIG. 6 and FIG. 7, a second inorganic coating layer is formed on the second organic layer 13 for an entire surface by a chemical vapor deposition process. The second inorganic coating layer is patterned by exposure process, etching process and development process to form a second inorganic layer 14 so that the second inorganic layer 14 comprises a plurality of second strips 140 which are spaced. An extension direction of the second strips 140 is the same as an extension direction of the first strips 120. The second strips 140 which are adjacent are isolated by the second organic layer 13. The second strip 140 comprises a second middle part 141 and second side parts 142 at two sides of the second middle part 141. The first middle parts 121 and the second middle parts 141 are staggered and the first side parts 122 and the second side parts 142 are overlapped.

Step S05, as shown in FIG. 8, forming a protective layer 15 on one side of the second organic layer 13 remote from the first organic layer 11 by a chemical vapor deposition process to form the flexible substrate 1. The protective layer 15 covers the second inorganic layer 14 and the second organic layer 13.

The detail description has been introduced above for the embodiment of the invention. Herein, a specific case is applied in this article for explain the principles and specific embodiments of the present invention have been set forth. The description of the aforesaid embodiments is only used to help understand the method of the present invention and the core idea thereof; meanwhile, for those of ordinary skill in the art, according to the idea of the present invention, there should be changes either in the specific embodiments and applications but in sum, the contents of the specification should not be limitation to the present invention.

What is claimed is:
1. A flexible substrate, comprising:
a first organic layer;
a first inorganic layer, patterned and provided on the first organic layer, wherein the first inorganic layer comprises a plurality of first strips which are spaced and the first strip comprises a first middle part and first side parts at two sides of the first middle part;

a second organic layer, covering the first inorganic layer; and a second inorganic layer, patterned and located on one side of the second organic layer remote from the first organic layer, wherein the second inorganic layer comprises a plurality of second strips which are spaced and the second strip comprises a second middle part and second side parts at two sides of the second middle part;

wherein an extension direction of the second strips is the same as an extension direction of the first strips, the second organic layer is partially interposed between two first strips which are adjacent and partially interposed between two second strips which are adjacent, the first middle parts and the second middle parts are staggered and the first side parts and the second side parts are overlapped.

2. The flexible substrate according to claim 1, wherein widths of the first side parts at the two sides of the first middle part are equal.

3. The flexible substrate according to claim 2, wherein a ratio of a width of the first middle part to the width of the first side part is a first value and the first value is equal to or larger than 2 and less than or equal to 3.

4. The flexible substrate according to claim 3, wherein a ratio of a width of the second middle part to the width of the second side part is a second value and the second value is equal to the first value.

5. The flexible substrate according to claim 4, wherein a thickness of the first inorganic layer is equal to a thickness of the second inorganic layer.

6. The flexible substrate according to claim 5, wherein a thickness of the first inorganic layer is less than a thickness of the second organic layer.

7. The flexible substrate according to claim 6, wherein the first strip comprises a first top surface and a first bottom surface which are oppositely arranged and first side surfaces connected between the first top surface and the first bottom surface, the first bottom surface is attached on the first organic layer, a first included angle is formed between the first side surface and the first bottom surface, the first included angle is equal to or larger than 30 degrees and equal to or less than 60 degrees.

8. The flexible substrate according to claim 1, wherein the first strip comprises a first top surface and a first bottom surface which are oppositely arranged and first side surfaces connected between the first top surface and the first bottom surface, the first bottom surface is attached on the first organic layer, a first included angle is formed between the first side surface and the first bottom surface, the first included angle is equal to or larger than 30 degrees and equal to or less than 60 degrees.

9. The flexible substrate according to claim 1, wherein the first organic layer and the second organic layer are made of a polyimide material.

10. The flexible substrate according to claim 1, wherein the flexible substrate further comprises a protective layer, the protective layer is located on one side of the second organic layer remote from the first organic layer and covers the second organic layer.

11. A flexible display, comprising a flexible substrate and the flexible substrate comprising:
a first organic layer;
a first inorganic layer, patterned and provided on the first organic layer, wherein the first inorganic layer comprises a plurality of first strips which are spaced and the first strip comprises a first middle part and first side parts at two sides of the first middle part;
a second organic layer, covering the first inorganic layer; and
a second inorganic layer, patterned and located on one side of the second organic layer remote from the first organic layer, wherein the second inorganic layer comprises a plurality of second strips which are spaced and the second strip comprises a second middle part and second side parts at two sides of the second middle part;

wherein an extension direction of the second strips is the same as an extension direction of the first strips, the second organic layer is partially interposed between two first strips which are adjacent and partially interposed between two second strips which are adjacent, the first middle parts and the second middle parts are staggered and the first side parts and the second side parts are overlapped.

12. The flexible display according to claim 11, wherein widths of the first side parts at the two sides of the first middle part are equal.

13. The flexible display according to claim 12, wherein a ratio of a width of the first middle part to the width of the first side part is a first value and the first value is equal to or larger than 2 and less than or equal to 3.

14. The flexible display according to claim 13, wherein a ratio of a width of the second middle part to the width of the second side part is a second value and the second value is equal to the first value.

15. The flexible display according to claim 14, wherein a thickness of the first inorganic layer is equal to a thickness of the second inorganic layer.

16. The flexible display according to claim 15, wherein a thickness of the first inorganic layer is less than a thickness of the second organic layer.

17. The flexible display according to claim 16, wherein the first strip comprises a first top surface and a first bottom surface which are oppositely arranged and first side surfaces connected between the first top surface and the first bottom surface, the first bottom surface is attached on the first organic layer, a first included angle is formed between the first side surface and the first bottom surface, the first included angle is equal to or larger than 30 degrees and equal to or less than 60 degrees.

18. The flexible display according to claim 11, wherein the first strip comprises a first top surface and a first bottom surface which are oppositely arranged and first side surfaces connected between the first top surface and the first bottom surface, the first bottom surface is attached on the first organic layer, a first included angle is formed between the first side surface and the first bottom surface, the first included angle is equal to or larger than 30 degrees and equal to or less than 60 degrees.

19. The flexible display according to claim 11, wherein the first organic layer and the second organic layer are made of a polyimide material.

20. The flexible display according to claim 11, wherein the flexible substrate further comprises a protective layer, the protective layer is located on one side of the second organic layer remote from the first organic layer and covers the second organic layer.

* * * * *